United States Patent [19]

Staples et al.

[11] Patent Number: 4,598,246
[45] Date of Patent: Jul. 1, 1986

[54] PRINTED CIRCUIT BOARD TESTER HAVING A FLEX AND WIPING ACTION FREE VACUUM ACTUATED EDGE CONNECTOR

[75] Inventors: Robert E. Staples, Lakeville; Joseph A. Ierardi, Norwood; Willis E. Golder, Holliston, all of Mass.

[73] Assignee: Pylon Company, Inc., North Attleboro, Mass.

[21] Appl. No.: 416,005

[22] Filed: Sep. 8, 1982

[51] Int. Cl.$^4$ .................. G01R 15/12; G01R 1/02
[52] U.S. Cl. .......................... 324/73 PC; 324/158 F
[58] Field of Search .......... 324/73 R, 73 AT, 73 PC, 324/158 F

[56] References Cited

U.S. PATENT DOCUMENTS

| | | | |
|---|---|---|---|
| 3,714,572 | 1/1973 | Ham et al. | 324/73 PC X |
| 3,970,934 | 7/1976 | Aksu | 324/158 F |
| 4,160,207 | 7/1979 | Haines | 324/158 F |
| 4,225,819 | 9/1980 | Gray et al. | 324/73 PC |

OTHER PUBLICATIONS

"Instructions for Finishing Pylon Test Heads for Use on Fairchild Thinline Test Systems", 4/82.
"Instructions for Finishing Pylon Flip-Top Fixtures", 4/82.
"Instructions for Test Fixture Kit Assembly 2272 Test Systems", 6/82.
"Instructions for Finishing Pylon 43000 Vacuum Test Head Kits", 2/82.

*Primary Examiner*—Ernest F. Karlsen
*Assistant Examiner*—Walter E. Snow
*Attorney, Agent, or Firm*—Weingarten, Schurgin, Gagnebin & Hayes

[57] ABSTRACT

An automated tester for a wired PC board is adapted to receive a wired PC board and secure it in a predetermined position by vacuum pressure. After the board is fully secured in position, the vacuum pressure applied to a fixture having an array of electrical contacts forces the contacts into position on the contact fingers of the PC board to provide electrical connection through the tester to connectors whereby the board can be tested. The contact array is controlled in position to make contact with the board fingers only after all board motion induced by the vacuum pressure pulldown has ceased, thereby minimizing scraping action between array contacts and PC board fingers. The fixture further includes a linkage arm arrangement which increases the contacting force of the array at the point of making connection to the PC board fingers to augment the reliability of contact.

16 Claims, 5 Drawing Figures

PRINTED CIRCUIT BOARD TESTER HAVING A FLEX AND WIPING ACTION FREE VACUUM ACTUATED EDGE CONNECTOR

FIELD AND BACKGROUND OF THE INVENTION

The present invention relates to test sets for testing wired PC boards. Large PC boards completely wired with components and interconnections are typically tested by securing them onto a surface. An array of electrical contacts are formed into contact with the electrical connection fingers on the connector edge of the PC board. Prior art designs have suffered from unreliability due at least in part to a lack of sufficient physical force to make reliable contact between a large number of arrayed contacts and the many PC board fingers. This is particularly true on automated designs in which the fingers and contact arrays are brought together automatically. Prior art devices are also known in which the array of contacts are pivoted downward onto the PC board fingers with the combined motion resulting in an undesirable wiping motion between the array contacts and PC board fingers.

BRIEF SUMMARY OF THE INVENTION

In accordance with the teaching of the present invention, a wired PC board tester is provided in which high reliability of electrical contact between PC board electrical contact fingers and a connector array of the tester is achieved without wiping action.

In implementing the preferred embodiment of the present invention, a PC board support surface is provided as a top surface of a frame having below it an interior chamber capable of receiving a vacuum. The vacuum is communicated to the support surface and in particular to apertures therethrough in order to receive and securely hold a PC board for testing. The vacuum also draws the support surface downward. An array of electrical contacts adapted to be lowered into electrical contact with the connector fingers along a peripheral edge of the PC board is actuated by a fixture responsive to the chamber vacuum to lower the array contacts into electrical connection with the fingers only after the vacuum has secured the PC board onto the surface and the full downward motion thereof under the influence of the vacuum has ceased. In this manner, any wiping action between fingers and array contacts is substantially reduced. The fixture is provided with a linkage converting the vacuum pressure to downward motion of the array of contacts onto the PC board fingers in such a manner as to greatly amplify the downward force over the last fractional portion of the range of motion of the array. This greatly increases the available pressure, forcing the array contacts into electrical connection with the PC board fingers so as to increase the reliability of connection therebetween.

The frame includes a plurality of electrical connectors which are wired to spring-loaded contacts in a contact board of the frame located below the PC board support surface. The PC board support surface contains through contacts positioned in locations to make connection to the spring-loaded contacts in the frame contact board when the PC board surface is deflected downwardly under the influence of the vacuum applied to the frame interior. The contact array includes mating connections which are also spring-loaded and adapted to contact the through connections of the PC board support surface and, by predetermined interconnection, provide electrical connection to predetermined ones of the array contacts adapted to make electrical connection to the PC board fingers. In this manner the array selectively defines the connection between frame connectors and PC board fingers.

BRIEF DESCRIPTION OF THE DRAWING

These and other features of the present invention are more fully set forth below in the solely exemplary detailed description and accompanying drawings, of which.

DETAILED DESCRIPTION

The present invention contemplates an automated tester for a wired PC board in which high reliability of contact between PC board fingers and a fixtured array of contacts is achieved by a mechanical linkage that enhances the pressure at the point of contact, and in which the wiping action resulting from selective engagement of the array of contacts with the PC board fingers is minimized.

Figure 1:
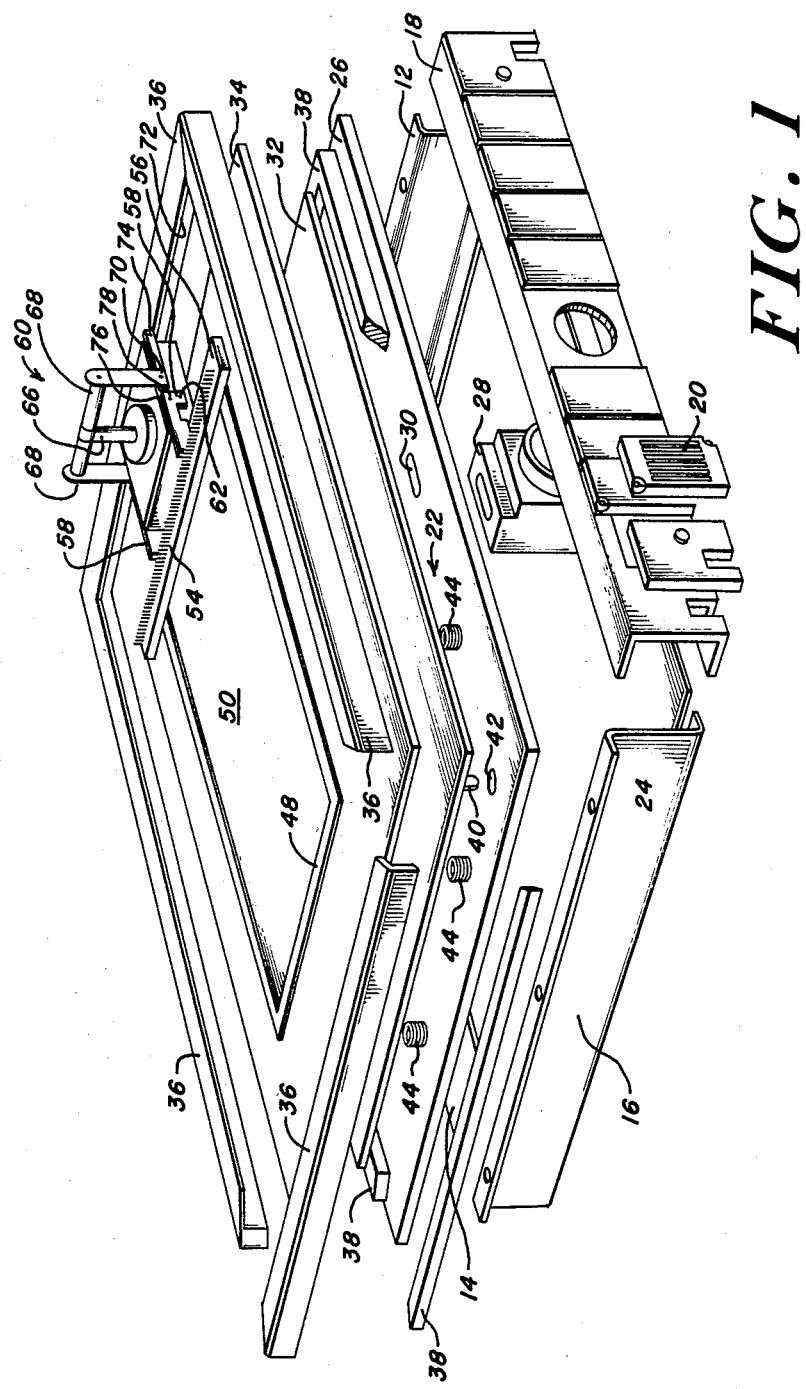
FIG. 1 is an exploded view of a wired PC board tester according to the present invention.

An exploded view of such a test system is illustrated with respect to FIG. 1. As shown there, a frame is defined by first, second, and third side panels 12, 14, and 16 and a front side panel 18 adapted to receive a plurality of electrical connectors 20. An interior is defined by the frame sides 12, 14, 16, and 18 and bottom plate 24 along with a top, connector board 26. The interior thus formed contains a vacuum conduit 28 adapted to provide connection of a vacuum source through the connector frame side 18 through the connector board 26 via aperture 30 to a sealed chamber 22 above the board 26 as described below.

Above the connector board 26 is a diaphragm board 32 and on top of that a diaphragm 34. The entire assembly of contact board 26, diaphragm board 32, and diaphragm 34 are sealed together to form chamber 22 by a set of clamps 36 and sealing bars 38. The diaphragm board 32 contains registration pins 40 adapted to mate within corresponding holes 42 in the connector board 26. Springs 44 are provided between the connector board 26 and diaphragm board 32 to resiliently support the diaphragm board 32 above the connector board 26 under the influence of a vacuum applied through the aperture 30. The sealing bar 38 is positioned on connector board 26 outside and surrounding the diaphragm board 32, permitting it to recede toward the connector board 26 against the resilient force of the spring 44 and under the pressure effects of the vacuum applied through the aperture 30. The diaphragm 34, however, is forced against the sealing bar lip 38 by the clamp 36.

The diaphragm 34 has a region covered by sealing tape 48 onto which a wired printed circuit (PC) board 50 is placed. The diaphragm board 32 and diaphragm 34 will typically have apertures in the region covered by the printed circuit board 50 in order to communicate the vacuum applied through port 30 through the diaphragm board 32 and diaphragm 34 to the printed circuit board 50, resulting in securely forcing it downwardly onto the diaphragm board 32 and tape 48. Board 32 is resiliently supported by the diaphragm 34 within the clamps 36 and resiliently supported by the springs 44 above the connector board 26.

Figure 2:
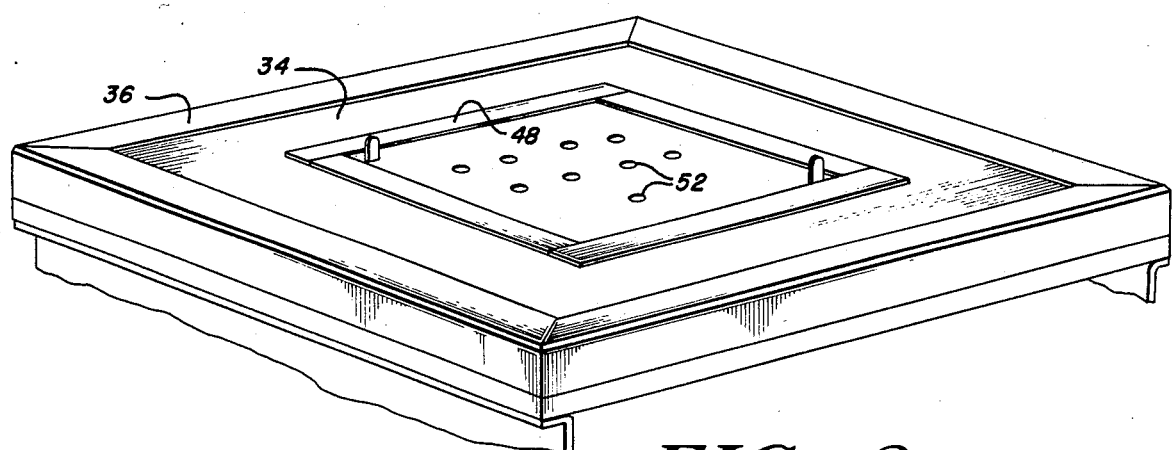
FIG. 2 is a partial view of an assembled PC board tester according to FIG. 1 during manufacture thereof.

FIG. 2 illustrates apertures 52 through the diaphragm board 32 and diaphragm 34 with the printed circuit board removed and within the bounds of tape 48 whereby vacuum is applied to the underside of board 50. Board 50 may have to be sealed by tape.

Returning to FIG. 1, electrical connection to the contact fingers of the printed circuit board 50 is provided through an array 54 of electrical contacts fixed within a contact bar 56 which is in turn supported by arms 58 of a fixture 60, adapted to selectively lower the array 54 and bar 56 over the printed circuit board 50 in response to the vacuum applied through the aperture 30 as described more fully below. The arms 56 are pivoted about pivots 62 in response to up and down motion of a gallows frame assembly comprising a cross bar 64 activated by a push rod 66 and connecting to side arms 68. The side arms 68 connect through pivots 70 on either side to a rear arm 72, rearwardly hinged about a pivot 74. A connector link 76 is secured between the pivots 62 and 70 such that up and down motion of the gallows assembly transmitted through arms 68 results in forcing arm 58 to rotate about a pivot 78, raising the contact array bar 56 with downward motion of the arms 68 and lowering the bar 56 to force the array of contacts 54 into electrical connection with the connector fingers of the PC board 50, with upward motion of the arms 68 induced by application of vacuum to the fixture 60 through the aperture 30.

Figure 4:
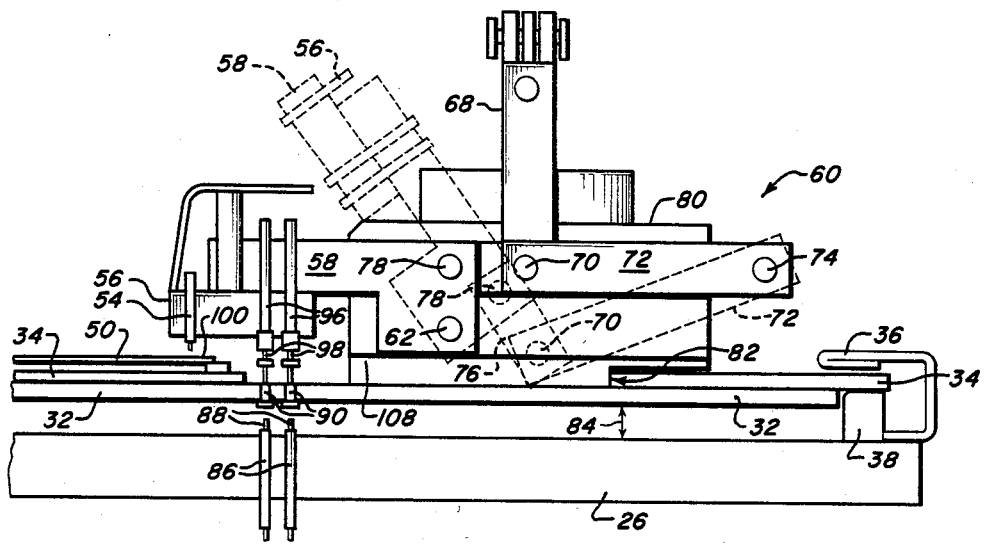
FIG. 4 is a detailed view of a pneumatically controlled fixture for positionally controlling the contact array of the invention of FIG. 1.
Figure 5:
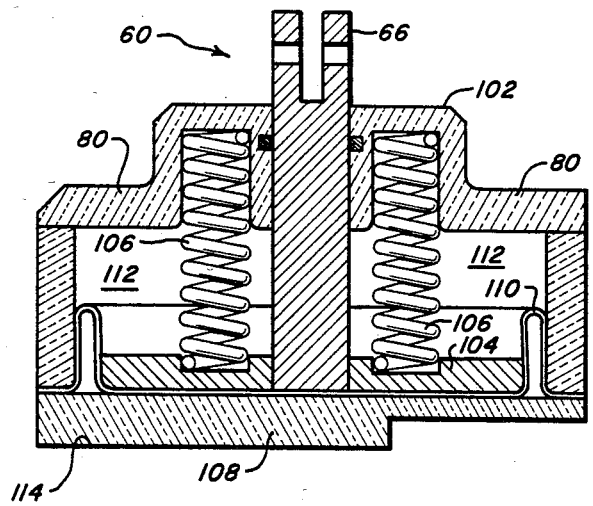
FIG. 5 is a sectional view of a portion of the fixture of FIG. 4.

The structural and operational features of the fixture 60 are more fully illustrated with respect to the views of FIGS. 4 and 5. In FIG. 4, the fixture 60 is illustrated with the contact bar 58 lowered in solid lines and raised in response to depression of the arms 68 in dashed lines. The fixture 60 includes a housing 80 which is typically attached by bolt or other means to the diaphragm board 32, through an aperture 82 of the diaphragm 34.

Figure 3:
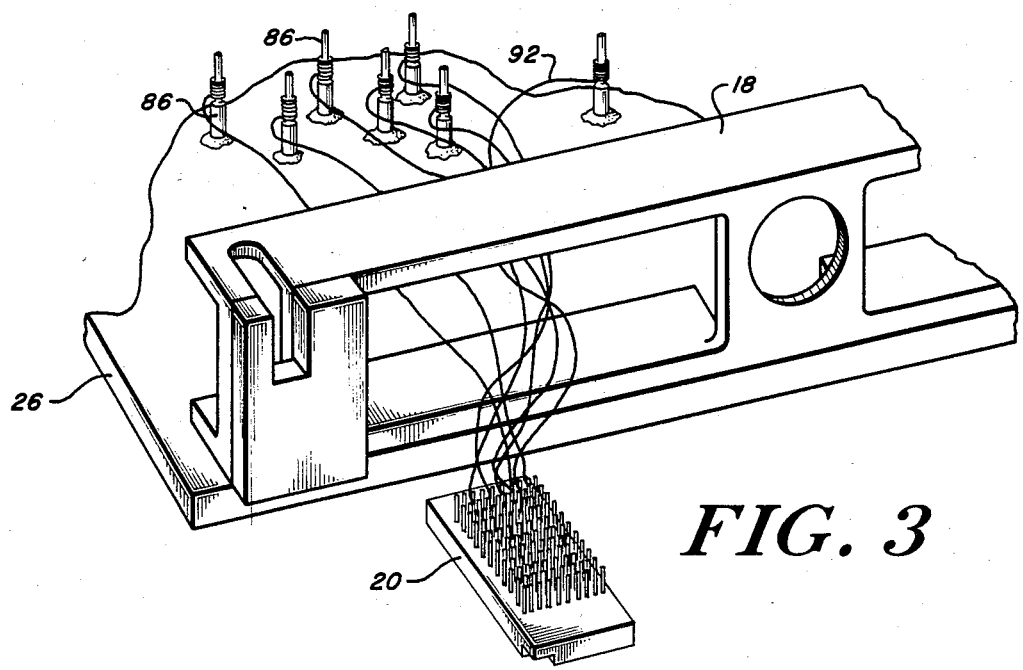
FIG. 3 illustrates wiring of frame connectors of the tester of FIG. 1.

Directly below the diaphragm board 32 and separated by a space 84 is the contact board 26, having therein a plurality of spring-loaded feed throughs 86. These have contact tips 88 which are spring-loaded and face through connectors 90 in the diaphragm board 34. The spring-loaded feadthroughs 86 in the contact board 26 are typically electrically connected to connectors 20 inserted into the side frame 18 via wires 92 as illustrated in FIG. 3.

Returning to FIG. 4, the contact bar 58 includes additional spring-loaded contacts 96 which face the feadthroughs 90 and provide electrical connection thereto through spring-loaded contacts 98 when the connector bar 58 is lowered over the diaphragm board 32. Contacts 96 are wired to contacts at array 54 in a desired pattern which can be changed by bolting a new bar 56 to arms 58.

As can be seen in FIG. 4, the connector link 76 couples up and down motion of the arm 68 through pivot 70 between link 76 and back arm 72 into rotational motion of the front arm 58, resulting in the application or removal of the bar 58 and contact array 54 to fingers 100 on the printed circuit board 50. The nature of the linkage effectively amplifies the force applied by arms 68 at the lower end of travel of bar 58. This results in a substantial increase of the downward force applied to the connector bar 58, greatly amplifying the force between the array 54 of contacts and the fingers 100, thereby increasing the reliability of connection therebetween. Link 76 also allows bar 56 to be raised high enough to facilitate changing board 50.

FIG. 5 provides an interior sectional view of the fixture 60, and in particular the housing 80. As shown there, the push rod of the gallows assembly is applied centrally through a dome portion 102 of the housing 80 to a bottom plate 104 which is urged resiliently downward by a set of, typically four, springs 106 installed between recesses in the dome 102 and plate 104. The housing 80 includes a bottom plate 108 and a bellow diaphragm 110 is peripherally secured between the facing edges of the bottom plate 108 and upper portion of the housing 80, looping upward and then down underneath the plate 104.

In the position illustrated in FIG. 5, a chamber 112 is formed in the region between the plate 104 and the dome 102 of housing 80. An aperture 114 in the bottom of the plate 108 communicates through a corresponding aperture in the diaphragm board 32 to the region between the diaphragm board 32 and the connector plate 26, which is in turn in communication with the vacuum applied through the aperture 30. This vacuum is applied through the aperture 114 to the chamber 112 through passages into the dome 102. This vacuum pressure forces the plate 104 upwardly taking with it the push rod 66 and in turn forcing the contact bar 58 to swing downwardly bringing the array 54 contacts into electrical connection with the fingers 100 on the printed circuit board 50 as illustrated in FIG. 4. The springs 106 are set with sufficient tension, however, to prevent upward motion of the push rod 66 until the effect of the vacuum has forced or drawn the printed circuit board 50 downwardly against the resilient effect of the diaphragm 34 and springs 44 the full extent of its travel. This minimizes the wiping action between the resilient or spring-loaded contacts in the array 54 and the fingers 100 of the printed circuit board 50.

The passage between the aperture 114 and the chamber 112 is preferably fitted with an adjustable restriction in order to adjust the impedance in the flow of gas between the chamber 112 and the vacuum source. This permits an adjustment over the rate of lowering of the contact bar 58 and contacts in the array 54.

It should be noted that where the above description calls for the use of spring-loaded electrical feedthrough connections, plunger connections according to U.S. Pat. No. 3,435,168 are of preferred design. Typically many such connections are made from board 26 to contacts on the underside of board 50.

This completes the description of the solely exemplary preferred embodiment of the present invention. The actual scope of the invention is to be defined solely in accordance with the following claims.

What is claimed is:

1. A printed circuit board tester having wiping-free action, comprising:
   a generally planar support having a normal to its plane for receiving a printed circuit board having a plurality of contacts to be tested spaced along a peripheral edge thereof in such a way that the edge contacts thereof are disposed on the surface of the printed circuit board but does not confront the generally planar support;

a frame;

means operatively coupled to said support for mounting said support for movement relative to said frame in a direction defined by said normal to the plane of said support between an inoperative test position and an operative test position spacially displaced from said in-operative test position; and means connected to said support and operative in response to the movement of said support for simultaneously electrically contacting said plurality of spaced contacts at a time when said support has been moved to its inoperative test position and for simultaneously electrically non-contacting said plurality of spaced contacts both at a time when said support has been moved to its inoperative test position, and at the times when said support is in movement through positions defined between said in-operative and said operative test positions;

said contacting and non-contacting means includes a contact array superadjacent said support, and means for mounting said contact array to said support for motion between a third position where said contact array is in electrical communication with said spaced contacts in response to said support being in its operative test position and a fourth position where said contact array is out of electrical contact with said contacts in response to said support being in its in-operative test position.

2. The invention of claim 1 wherein said support is a printed circuit board receiving diaphragm; and wherein said mounting means includes a contact board subjacent said printed circuit board receiving diaphragm fastened to said frame, and means for mounting said printed circuit board receiving diaphragm for motion in a direction normal to its plane relative to said contact board.

3. The invention of claim 2 wherein said diaphragm mounting means includes a vacuum chamber.

4. The invention of claim 1 wherein said mounting means includes means for mounting said contact array for pivotal motion relative to said support between said third and fourth positions respectively in response to said support being in its operative and inoperative tests positions.

5. The invention of claim 4, wherein said pivotal mounting means further includes means operative to bring said contact array into contact with said contacts under augmented pressure over a last portion of travel thereof in traveling just into contact with said contacts.

6. The invention of claim 4 further including means for interposing a predetermined time delay between the actuation of said support moving means and said pivoting means.

7. A flex-free printed circuit board tester for testing a printed circuit board having an array of signal contacts disposed along an edge of one side thereof, comprising:

a printed circuit board receiving surface having a plurality of first contacts disposed therein, said printed circuit board receiving surface receives the printed circuit board in such a way that the other side of the printed circuit board confronts the printed circuit board receiving surface so that the signal contacts are exposed;

a subjacent contact board having a plurality of second contacts disposed therein aligned with corresponding ones of said first contacts;

first means for mounting said printed circuit board receiving surface for motion relative to said contact board between a first position where individual ones of said first and second contacts are in mechanical and electrical communication and a second position where individual ones of said first and second contacts are out of mechanical and electrical communication;

a probe support strip superjacent said printed circuit board receiving surface having a plurality of third contacts disposed therein and individually aligned to contact a corresponding one of said signal contacts, and having a plurality of fourth contacts disposed therein and spaced from said third contacts and individually aligned to contact corresponding ones of said first contacts carried by said printed board receiving surface;

a plurality of electrical connectors selectively fastened between preselected pairs of said third and fourth contacts and in such a way that the connectors are stationary with respect to said probe support; and second means coupled to said probe support and said printed circuit board receiving surface and responsive to said first means for mechanically and electrically communicating aligned pairs of both said third contacts and said signal contacts and said fourth contacts and said first contacts in response to said printed circuit board receiving surface being in said first position and for electrically and mechanically disengaging aligned pairs of both said third contacts and said signal contacts and said fourth contacts and said first contacts in response to said printed circuit board being in said second position;

whereby, flex-free testing of said signal contacts is accomplished by reason that said plurality of electrical connectors selectively fastened between preselected pairs of said third and fourth contacts in being stationary with respect to said probe support do not move relative thereto so that flexing thereof is not possible.

8. The invention of claim 7 wherein said first means includes a vacuum chamber operatively coupled between said printed circuit board receiving surface and said contact board, the negative pressure of said vacuum chamber being operable to linearly move said printed circuit board receiving surface relative to said contact board.

9. The invention of claim 8 wherein said second means includes an arm mounted for pivotal motion relative to said printed circuit board receiving surface, and means mounted to said arm and coupled to said vacuum chamber for pivoting said arm to bring said third and said fourth contacts into mechanical and electrical communication respectively with said signal contacts and said first contacts not until said printed circuit board receiving surface is in its first position.

10. The invention of claim 7 wherein said electrical connectors are wires.

11. A printed circuit board tester having a flex and wiping action free edge connector; comprising:

a first surface, having first through contacts, for receiving a printed circuit board having a plurality of edge contacts on a face thereof in such a way that the edge contacts are disposed on the face of the printed circuit board that is not confronting the first surface when the printed circuit board is received on the first surface;

a second surface having second contacts aligned with corresponding ones of said first contacts and connectable to automatic testing equipment;

first means for mounting said first surface superjacent said contact surface for first movement relative to said second surface between a first position where said first and said second contacts are in spaced relation and a second position where said first and said second contacts are in abutting relation;

a third surface having spaced third and fourth contacts, said third contacts are aligned with corresponding ones of said edge contacts and are selectively electrically connected to preselected ones of said fourth contacts that are aligned with corresponding ones of said first contacts;

second means for mounting said third surface superjacent said first surface for second movement relative to said first surface between a third position where said third and said fourth contacts are respectively spaced from said edge contacts and said first contacts and a fourth position where said third contacts and said fourth contacts are respectively abutting said edge contacts and said first contacts; and third means coupled between said first means and said second means for controlling the operation of said second means in response to said first means in such a way that said third surface is in its third position whenever said first surface is in its first position and assumes its fourth position not before said first surface assumes its second position.

12. The invention of claim 11 wherein said first movement is linear movement.

13. The invention of claim 12 wherein said first means includes a vacuum actuated chamber.

14. The invention of claim 11 wherein said second movement is pivotal motion.

15. The invention of claim 14 wherein said second means includes a vacuum actuated chamber, and wherein said third means includes a vacuum regulator.

16. The invention of claim 11 further includes means coupled to said second means for increasing the force of contact of said third contacts with said edge contacts as said third surface moves from its third position to its fourth position.

* * * * *